United States Patent [19]

Nogawa et al.

[11] Patent Number: 4,920,094
[45] Date of Patent: Apr. 24, 1990

[54] PROCESS FOR PRODUCING SUPERCONDUCTING THIN FILMS

[75] Inventors: Shuichi Nogawa; Eiji Kamijo, both of Kyoto, Japan

[73] Assignee: Nissin Electric Co., Ltd., Kyoto, Japan

[21] Appl. No.: 173,565

[22] Filed: Mar. 25, 1988

[30] Foreign Application Priority Data

Mar. 27, 1987 [JP] Japan .................................. 62-75583

[51] Int. Cl.$^5$ .......................... C23C 14/46; B05D 5/12
[52] U.S. Cl. .................................... 505/1; 204/192.24;
204/192.11; 204/298.36; 427/62; 427/38;
505/731; 505/730
[58] Field of Search .............. 204/192.11, 298, 192.12, 204/192.24; 427/62, 38; 505/1, 731, 730

[56] References Cited

U.S. PATENT DOCUMENTS

| 4,404,263 | 9/1983 | Hodes et al. | 204/298 |
| 4,430,190 | 2/1984 | Eilers et al. | 204/298 |
| 4,468,313 | 8/1984 | Okumura et al. | 204/298 TS |
| 4,793,908 | 12/1988 | Scott et al. | 204/192.26 |

FOREIGN PATENT DOCUMENTS 59-208815  11/1984  Japan .................................. 204/298

OTHER PUBLICATIONS

Kawasaki et al., "Compositional and Structural Analyses for Optimizing the Preparation Conditions of Superconducting $(La_{1-x}Sr_x)_yCu\ O_{4-\delta}$ Films by Sputtering", Jpn. J. Appl. Phys., vol. 26, No. 4, Apr., 1987, pp. L388-390.

Erler et al., "Nitride Film Deposition by Reactive Ion Beam Sputtering", Thin Solid Films 65(1980), 233-245.

Harper, "Ion Beam Deposition", Thin Film Processes edited by Vossen et al, Academic Press 1978, pp. 175-198.

Wu et al, "Superconductivity at 93K in a New Mixed-–Phase Y—Ba—Cu—O Compound System at Ambient Pressure", Phys. Rev. Lett. 58(9), Mar. 1987, pp. 908-910.

Primary Examiner—Norman Morgenstern
Assistant Examiner—Roy V. King
Attorney, Agent, or Firm—Finnegan, Henderson, Farabow, Garrett and Dunner

[57] ABSTRACT

A process for producing a superconducting thin film on a surface of a substrate of the present invention comprises the steps of: sputttering a target made of a group IIIa metal and/or an oxide thereof, a group IIa metal and/or an oxide thereof and copper and/or an oxide theref with an ion beam or a neutral beam to allow the sputtered particles from the target to be deposited on the substrate; and impinging an oxygen neutral beam on the substrate.

8 Claims, 1 Drawing Sheet 4,920,094

PROCESS FOR PRODUCING SUPERCONDUCTING THIN FILMS

BACKGROUND OF THE INVENTION

The present invention relates to a process for producing a superconducting thin film, especially to a process for forming a superconducting thin film made of a IIIa-IIa-Cu oxide on a surface of a substrate.

Superconducting materials hold much promise for use in various cryoelectronic devices such as Josephson devices and SQUID (superconducting quantum ineterference device) sensors. However, conventional superconducting materials have been processed into oxide ceramics by the sintering process whichis practically ineffective for the production of superconducting thin films.

SUMMARY OF THE INVENTION

An object, therefore, of the present invention is to provide a process for forming a superconducting thin film on a surface of a substrate.

This object of the present invention can be attained by forming a superconducting thin film on the surface of a substrate through the combined use of a means for sputtering a target made of a group IIIa metal and/or an oxide thereof, a group IIa metal and/or a oxide thereof and copper and/or an oxide thereof with an ion beam or a neutral beam and which allows the sputtered particles from the target to be deposited on the substrate, and a means for permitting an oxygen neutral beam to impinge on the substrate. The group IIIa metals include scandium, yttrium, lanthanide, elements, and the group IIa metals include magnesium, calcium, strontium, and barium.

When an ion beam or a neutral beam is permitted to impinge on the target, it makes elastic collision with the structural atoms and molecules in the surface of the target. As a result, these atoms and molecules are sputtered and the sputtered particles are deposited on the substrate. Since an oxygen neutral beam is being permitted to impinge on the substrate, it reacts with the deposited particles to form a superconducting thin film made of a IIIa-IIa-Cu oxide on the surface of the substrate.

DETAILED DESCRIPTION OF THE INVENTION

Figure 1:
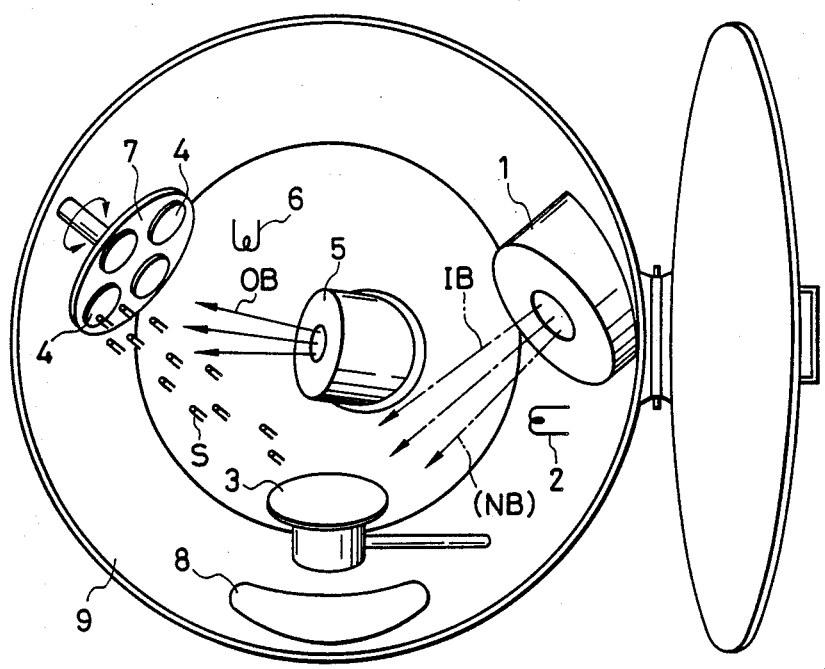
FIG. 1 shows schematically the interior of a thin-film forming apparatus that may be used to implement the method of the present invention.

An embodiment of the present invention is described hereinafter with reference to the accompanying drawing. FIG. 1 shows schematically the interior of a thin-film forming apparatus that is suitable for use in implementing the method of the present invention. An inert gas such as Argon is ionized and extracted with an extracting electrode system in a sputtering ion source 1 from which the resulting ion beam (IB) is emitted. The ion beam (IB) is neutralized by means of a neutralizing filament 2 that is made of a suitable metal such as tantalum or tungsten and which is optionally used if a target 3 to be described later in this specification is made of an insulating material. The target 3 is sputtered with the neutralized beam, which is hereinafter sometimes referred to as a neutral beam (NB). If the target 3 is made of an insulating material, static charges will build up as a result of impingement of an ion beam and if they exceed a certain limit, insulation breakdown occurs and the target will be disrupted. Neutralization of the ion beam (IB) is effective for the purpose of preventing such troubles and is not particularly needed if the target 3 is made of a metal.

Figure 2:
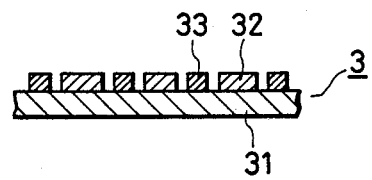
FIG. 2 shows a cross section of a target that may be used in the apparatus shown in FIG. 1.

The target 3 may be a solid target that is composed of a group IIIa metal and/or an oxide thereof, a group IIa metal and/or an oxide thereof and copper and/or an oxide thereof, which is prepared by mixing the powders of these components at desired molar ratios and calcining the mix at 1,000°–1,200° C. Alternatively, a composite target may be prepared by the following procedures: the powders of a group IIIa metal and/or a oxide thereof and a group IIa metal and/or a oxide thereof are mixed at desired molar ratios; the mix is calcined at elevated temperatures as in the preparation of the solid target; rectangular chips are formed from the calcined product; and a plurality of these chips are disposed on a plate made of copper and/or an oxide thereof in such a way that the area covered by the chips assumes a predetermined proportion of the copper and/or copper oxide plate. FIG. 2 shows another modification of the composite target 3, in which a plate 31 made of copper and/or an oxide thereof is overlaid with chips 32 made of a group IIIa metal and/or an oxide thereof and chips 33 made of a group IIa metal and/or an oxide thereof, thereby forming a composite target in which a predetermined proportion of the surface area of the plate is assumed by the chips 32 and 33.

The apparatus shown in FIG. 1 also includes substrates 4 typically made of zirconia or sapphire, on the surface of which sputtered particles S emitted from the target 3 sputtered with the ion beam (IB) or neutral beam (NB) are to be deposited. The surface of the substarets 4 also provides an area where an oxygen neutral beam (OB) to be described later in this specification will impinge.

An oxygen ion beam is extrated from an extracting electrode system in an oxygen ion source 5. This beam is neutralized to an oxygen neutral beam (OB) with electrons emitted from a neutralizing filament 6 typically made of tantalum or tungsten. The substrates 4 are supported by a substrate holder 7 which optionally has a built-in heater for heating the substrates 4. The apparatus shown in FIG. 1 has a gas outlet 8 through which vacuum is to be drawn from a film-forming compartment 9 in the apparatus.

The ion beam (IB) with an energy of approximately 500–2,000 eV that has been extracted from the ion source 1 enters the film-forming compartment 9 where it is converted to a neutral beam (NB) by neutralization with electrons from the filament 2, the neutral beam then sputtering the target 3 made of a group IIIa metal and/or an oxide thereof, a group IIa metal and/or an oxide thereof, and copper and/or an oxide thereof. The sputtered particles S emitted from the target 3 are deposited on the substrates 4. Simultaneously or alternately with the emission of the ion beam (IB), an oxygen ion beam having an energy of approximately 50–500 eV is extracted, optionally intermittently, from the oxygen ion source 5 and enters the film-forming compartment 9, where it is converted to an oxygen neutral beam (OB) by neutralization with electrons from the filament 6, the neutral beam then impinging on the substrates 4. As a result, the sputtered particles S react with the oxygen neutral beam (OB) to form a superconducting thin film on the surface of the substrate whichis made of an oxide of the IIIa-IIa-Cu system.

The following examples were conducted by the present inventors for the purpose of further illustrating the present invention but are in no way to be taken as limiting.

EXAMPLE 1

A solid target 3 with a diameter of 75 mm$\phi$ was prepared by mixing $Y_2O_3$, BaO and CuO powders at a molar ratio of 3:6:1 and calcining the mix in an electric furnace at 1,000° C. for 2 hours. Substrates 4 made of square sapphire (18×18 mm) were attached to a substrate holder 7 and heated at 700° C. while the holder was rotating. Using the target 3 and the substrates 4, a film-forming experiment was conducted under the following conditions:

$Ar^+$ ion beam as sputtering ion source 1;
1 keV×50 mA as beam energy of the $Ar^+$ ion beam; neutralizing filament 2 supplied with 5 V voltage and 5 A current;
$O^+$ ion beam as oxygen ion source 5; 100 eV×1 mA as beam energy of the $O^+$ ion beam; and
neutralizing filament 6 supplied with 3 V voltage and 3 A current.

As a result, a superconducting thin film of 1 μm thick that was made of Y-Ba-Cu oxide was formed on the surface of the sapphire substrates 4. Gold electrodes were formed on this super conducting film by sputtering and the electrical resistance across this film was measured in liquid nitrogen. Zero resistance was confirmed.

EXAMPLE 2

A composite target 3 was prepared by the following method: $Y_2O_3$ and BaO powders were mixed at a molar ratio of 1:2 and calcined in an electric furnace at 1,000° C. for 2 hours; the calcined product was cut into rectangular chips (4×6 mm) which were placed on a copper plate so as to cover 60% of its area. Substrates 4 made of circular zirconia (20 mm$\phi$) were attached to a substrate holder 7 and heated at 700° C. while the holder was rotating. Using the traget 3 and the substrates 4, a film-forming experiment was conducted under the following conditions:

$Ar^+$ ion beam as sputtering ion source 1;
1 keV×50 mA as beam energy of the $Ar^+$ ion beam; neutralizing filament 2 supplied with 5 V voltage and 5 A current;
$O^+$ ion beam as oxygen ion source 5;
100 eV×1 mA as beam energy of the $O^+$ ion beam; and
neutralizing filament 6 supplied with 3 V voltage and 3 A current.

As a result, a superconducting thin film of 1 μm thick that was made of a Y-Ba-Cu oxide was formed on the surface of the zirconia substrates 4. Gold electrodes were formed on this superconducting film by sputtering and the electrical resistance across this film was measured in liquid nitrogen. Zero resistance was confirmed.

In the EXAMPLEs 1 and 2, the superconducting thin films were formed by depositing sputtered particles on the heated substrates 4. Needless to say, films may be formed without heating the substrates, with the formed films being optionally subjected to annealing. Besides $Ar+$, the ion beams may consist of other ionic species such as Kr and Xe. It should also be stressed that the neutralizing filaments 2 and 6 may be designed as a common filament that neutralizes either the sputtering ion beam or oxygen ion beam as required.

As will be apparent from the foregoing description, the process of the present invention has the advantage that it enables the formation of a superconducting thin film from a IIIa-IIa-Cu oxide.

The present invention will not be limited to the embodiment and the examples described above and various modifications may be made without departing from the spirit or scope of the invention. For instance, the substrate 4 may be in wire form which can be provided with a coating of IIIa-IIa-Cu oxide by the method of the present invention. The resulting product can be wound into a coil form which is suitable for use as a superconducting coil.

We claim:

1. A process for producing a superconducting thin film on a surface of a substrate, comprising the steps of: sputtering a target made of a group IIIa metal and/or an oxide thereof, a group IIa metal and/or an oxide thereof and copper and/or an oxide thereof with an ion beam or a neutral beam to allow particles sputtered from the target to be deposited on the substrate, said group IIIa metal being selected from scandium, yttrium, and lanthanide elements and said group IIa metal being selected from magnesium, calcium, strontium, and barium; and impinging an oxygen neutral beam on the substrate, to thereby form a thin film of a IIa-IIa-Cu oxide.

2. A process of claim 1, wherein said step of sputtering a target with ion beam or a neutral beam and said step of impinging an oxygen neutral beam on the substrate are conducted simultaneously with each other.

3. A process of claim 1, wherein said step of sputtering a target with ion beam or a neutral beam and said step of impinging an oxygen neutral beam on the substrate are conducted alternately with each other.

4. A process of claim 1, further comprising the step of heating the substrate while the sputtered particles from the target are deposited on the substrate.

5. A process of claim 1, wherein prior to sputtering the target, an ion beam is neutralized and prior to impinging on the substrate, an oxygen ion beam is neutralized to provide the neutral beam and the oxygen neutral beam.

6. A process of claim 1, further comprising the step of forming the target, said step having the steps of:
mixing at desired molar ratios powders of a group IIIa metal and/or an oxide thereof, a group IIa metal and/or an oxide thereof and copper and/or an oxide thereof; and
calcining the mix at a high temperature to thereby form a solid target.

7. A process of claim 1, further comprising the step of forming the target, said step having the steps of:
mixing at desired molar ratios powders of a group IIIa metal and/or an oxide thereof and a group IIa metal and/or an oxide thereof;
calcining the mix at high temperature;
forming rectangular chip from the calcined product; and
disposing the chip on a plate made of copper and/or an oxide thereof so that the area covered by the chip assumes a predetermined proportion of the copper and/or copper oxide plate, to thereby form a composite target.

8. A process of claim 1, further comprising the step of forming the target, said step having the steps of:
preparing a chip from powders of a group IIIa metal and/or an oxide thereof;
preparing a chip from powders of a group IIa metal and/or an oxide thereof; and
disposing the chips on a plate made of copper and/or an oxide thereof so that the area covered by the chips assumes a predetermined proportion of the copper and/or copper oxide plate, to thereby form a composite target.

* * * * *

UNITED STATES PATENT AND TRADEMARK OFFICE
CERTIFICATE OF CORRECTION

PATENT NO. : 4,920,094

DATED : April 24, 1990

INVENTOR(S) : SHUICHI NOGAWA, et al.

It is certified that error appears in the above-identified patent and that said Letters Patent is hereby corrected as shown below:

Claim 1, column 4, line 31, "IIa-IIa-Cu" should be --IIa-IIIa-Cu--.

Title Page:
Abstract, line 6, "theref" should be -- thereof--.

Signed and Sealed this

Seventh Day of April, 1992

Attest:

HARRY F. MANBECK, JR.

*Attesting Officer*    *Commissioner of Patents and Trademarks*